United States Patent
Yamanaka et al.

(10) Patent No.: US 10,411,508 B2
(45) Date of Patent: Sep. 10, 2019

(54) NON-CONTACT POWER SUPPLY DEVICE, AND PROCESSING APPARATUS INCLUDING NON-CONTACT POWER SUPPLY DEVICE

(71) Applicant: SINFONIA TECHNOLOGY CO., LTD., Tokyo (JP)

(72) Inventors: Yuji Yamanaka, Tokyo (JP); Mamoru Kosaki, Tokyo (JP); Hideaki Moriya, Tokyo (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 444 days.

(21) Appl. No.: 15/237,119

(22) Filed: Aug. 15, 2016

(65) Prior Publication Data

US 2017/0054325 A1     Feb. 23, 2017

(30) Foreign Application Priority Data

Aug. 21, 2015 (JP) ................... 2015-163983

(51) Int. Cl.
*H02J 50/10* (2016.01)
*H01L 21/677* (2006.01)
(Continued)

(52) U.S. Cl.
CPC ............ *H02J 50/10* (2016.02); *H01L 21/677* (2013.01); *H01L 21/6838* (2013.01); *H05K 7/2039* (2013.01)

(58) Field of Classification Search
CPC ............. H02J 50/10; H02J 50/12; H02J 50/90
See application file for complete search history.

(56) References Cited

U.S. PATENT DOCUMENTS 6,005,304 A * 12/1999 Seelig ................. H02J 50/12
                                                      307/104
6,922,324 B1   7/2005 Horwitz
(Continued)

FOREIGN PATENT DOCUMENTS

JP     S52-5103 A    1/1977
JP     S62-296398 A  12/1987
(Continued)

OTHER PUBLICATIONS

Extended European Search Rpoert dated Dec. 9, 2016 in corresponding EP Application No. 16184477.4.
(Continued)

*Primary Examiner* — Fritz M Fleming
(74) *Attorney, Agent, or Firm* — Knobbe, Martens, Olson & Bear, LLP (57) ABSTRACT

A non-contact power supply device is used in a processing apparatus including a moving unit movable inside a closed container. The device supplies electric power to the moving unit from outside the closed container. The power supply device includes a feed unit and a heat dissipater. The feed unit includes a feed line and a power supply transformer. The feed line has a feed region arranged inside the closed container along the moving direction of the moving unit. The transformer is arranged inside the closed container so as to be opposed to the feed region in a non-contact manner and is provided so as to move together with the moving unit. The heat dissipater includes a portion on one end side connected to the feed region so as to be capable of conducting heat thereto, and a portion on the other end side extending outside the closed container, so that heat generated in the feed region is partially dissipated outside the closed container.

7 Claims, 9 Drawing Sheets

(51) Int. Cl.
*H01L 21/683* (2006.01)
*H05K 7/20* (2006.01)

(56) References Cited

U.S. PATENT DOCUMENTS

| | | | |
|---|---|---|---|
| 8,177,048 B2 | 5/2012 | Sato et al. | |
| 9,796,273 B2 | 10/2017 | Ragazzini | |
| 2010/0036523 A1 | 2/2010 | Sato et al. | |
| 2010/0270970 A1* | 10/2010 | Toya | H02J 50/90 320/108 |
| 2011/0074344 A1* | 3/2011 | Park | H02J 50/90 320/108 |
| 2012/0043931 A1* | 2/2012 | Terao | H02J 50/12 320/108 |
| 2013/0009596 A1* | 1/2013 | Toya | H02J 50/12 320/108 |
| 2015/0255992 A1* | 9/2015 | Abe | H02J 50/10 307/104 |
| 2015/0280454 A1* | 10/2015 | Takeda | H02J 50/12 307/104 |
| 2016/0152141 A1 | 6/2016 | Ragazzini | |
| 2016/0261150 A1* | 9/2016 | Mizoguchi | H02J 50/80 |
| 2018/0006497 A1* | 1/2018 | Morita | H02J 50/12 |

FOREIGN PATENT DOCUMENTS

| | | |
|---|---|---|
| JP | H10-225024 A | 8/1998 |
| JP | 2008-019470 A | 1/2008 |
| JP | 2010-041888 A | 2/2010 |
| JP | 2010-042690 A | 2/2010 |
| JP | 2010-047169 A | 3/2010 |
| JP | 2013-135040 A | 7/2013 |
| JP | 5470770 B2 | 2/2014 |
| JP | 2014-049560 A | 3/2014 |
| WO | 2011/126228 A1 | 10/2011 |
| WO | 2014/203098 A | 12/2014 |

OTHER PUBLICATIONS

Japanese Office Action for JP Application No. 2015-163983, dated Apr. 5, 2018 in 3 pages.

\* cited by examiner

NON-CONTACT POWER SUPPLY DEVICE, AND PROCESSING APPARATUS INCLUDING NON-CONTACT POWER SUPPLY DEVICE

CROSS-REFERENCE TO RELATED APPLICATION

This application claims the benefit of Japanese Patent Application No. 2015-163983, filed on Aug. 21, 2015, which is incorporated herein by reference.

BACKGROUND OF THE INVENTION

Field of the Invention

The present invention relates to a non-contact power supply device, and to a processing apparatus that includes the non-contact power supply device and that is configured to convey an object to be processed such as a semiconductor wafer substrate and a glass substrate inside a closed container, and perform other processes.

Background Art

As a processing apparatus of this type, a processing apparatus including a movable body that is made movable by driving a linear motor has been conventionally proposed. Though not shown in the figures, a processing apparatus including a feed line arranged on a holder, a power supply transformer arranged to be opposed to the feed line directly thereabove, and a movable body placed on the power supply transformer via a member such as a base, for example, has been proposed. That is, the feed line and the power supply transformer in the processing apparatus are configured to be opposed to each other in a non-contact manner in the atmosphere.

Meanwhile, the object to be processed such as a semiconductor wafer substrate and a glass substrate is preferably processed under vacuum at a pressure lower than the atmospheric pressure. Therefore, the movable body is possibly housed in the closed container. As a processing apparatus configured to house a movable body in a closed container, a processing apparatus disclosed in JP 5470770 B, for example, has been proposed. In the processing apparatus according to this literature, a primary feed line is arranged outside the closed container capable of maintaining the vacuum state. Further, a power supply transformer configured to be supplied with power from the primary feed line in a non-contact manner and a movable body configured to move with the movement of the power supply transformer are arranged inside the closed container. That is, the power supply transformer is arranged along the primary feed line inside the closed container via a partition wall of the closed container.

In the processing apparatus of the above-described literature, a high-frequency current is allowed to flow through the primary feed line, and the number of magnetic flux is temporally changed, thereby allowing the primary feed line to be magnetically coupled to a secondary winding of the power supply transformer via the power supply transformer. As a result, a voltage is induced in the secondary winding of the power supply transformer, and electric power is supplied from the primary feed line to the secondary winding. Further, since the secondary winding is formed as a resonance circuit, the reactive power is reduced, and the power transmission efficiency is increased.

However, the magnetic coupling between the primary feed line and the secondary winding depends on the distance of the space present therebetween. Therefore, in the case where power is supplied to the secondary winding from the primary feed line via the partition wall, as in the processing apparatus of the above-described literature, the distance of the space present between the primary feed line and the secondary winding increases due to the presence of the partition wall. With the increase of the distance of the space, the power transmission efficiency from the primary feed line to the secondary winding decreases, which is a problem.

Therefore, in order to reduce the distance of the space present between the primary feed line and the secondary winding as much as possible, it is conceivable to arrange both the primary feed line and the power supply transformer (secondary winding) inside the closed container. According to this configuration, the two are directly opposed to each other without the partition wall to increase the coupling coefficient and to improve the transmission efficiency. However, this configuration has a problem of heat generation in the primary feed line and the secondary winding.

As heat dissipation methods, heat-conduction, convection, and radiation are generally known. However, in the closed container, which is a closed space, none of the heat dissipation methods may not be effective. In particular, when the inside of the closed container is under vacuum, heat dissipation by heat-conduction or convection is impossible, and even radiation is not an effective heat dissipation method. Then, heat generated in the primary feed line and the secondary winding as a loss remains inside the closed container. Such a problem occurs not only in the case of a processing apparatus in which the inside of the closed container is under vacuum, but also in the case of a processing apparatus in which the inside of the closed container is under atmospheric pressure in the same manner.

SUMMARY OF THE INVENTION

In view of the above-described problems, it is therefore an object of the present invention to provide a non-contact power supply device and a processing apparatus capable of dissipating heat generated from the primary feed line, even if the primary feed line and the power supply transformer including the secondary winding are arranged inside the closed container.

The following presents a simplified summary of the invention disclosed herein in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention is a non-contact power supply device that is used in a processing apparatus including a closed container and a moving unit provided inside the closed container so as to be movable inside the closed container, and that is capable of supplying electric power to the moving unit from outside the closed container, the non-contact power supply device including: a feed unit; and a heat dissipater, wherein the feed unit includes a feed line and a power supply transformer, the feed line includes a feed region arranged inside the closed container along the moving direction of the moving unit, the power supply transformer is arranged inside the closed container so as to be opposed to the feed region in a non-contact manner and is provided to move together with the moving unit, and the heat dissipater includes a portion on one end side connected to the feed region so as to be capable of conducting heat thereto and a portion on the other end side extending outside the closed container.

In the non-contact power supply device of the present invention, a configuration in which the portion on one end side of the heat dissipater is electrically connected to the feed region, and electric power is supplied from the portion on the other end side of the heat dissipater to the feed region can be employed.

In the non-contact power supply device of the present invention, a configuration in which the non-contact power supply device further includes a plurality of connecting parts configured to connect the portion on one end side of the heat dissipater to the feed region of the feed line, wherein the plurality of connecting parts are arranged along a longitudinal direction of the feed region, so that an equal number of connecting parts are present at a position where the power supply transformer is present, regardless of the position of the power supply transformer, can be employed.

In the non-contact power supply device of the present invention, a configuration in which the closed container is capable of maintaining its internal pressure lower than the atmospheric pressure can be employed.

A processing apparatus of the present invention includes: a closed container; a moving unit provided inside the closed container so as to be movable inside the closed container; and the aforementioned non-contact power supply device.

BRIEF DESCRIPTION OF THE DRAWINGS

The foregoing and other features of the present invention will become apparent from the following description and drawings of an illustrative embodiment of the invention in which.

DETAILED DESCRIPTION OF THE PREFERRED EMBODIMENT

Hereinafter, a non-contact power supply device according to an embodiment of the present invention when used in a vacuum processing apparatus that is used with the inside of the closed container maintained at a pressure lower than the atmospheric pressure will be described as an example. This vacuum processing apparatus is used for conveying an object to be processed such as a semiconductor wafer substrate or a glass substrate or performing other processes.

Figure 1:
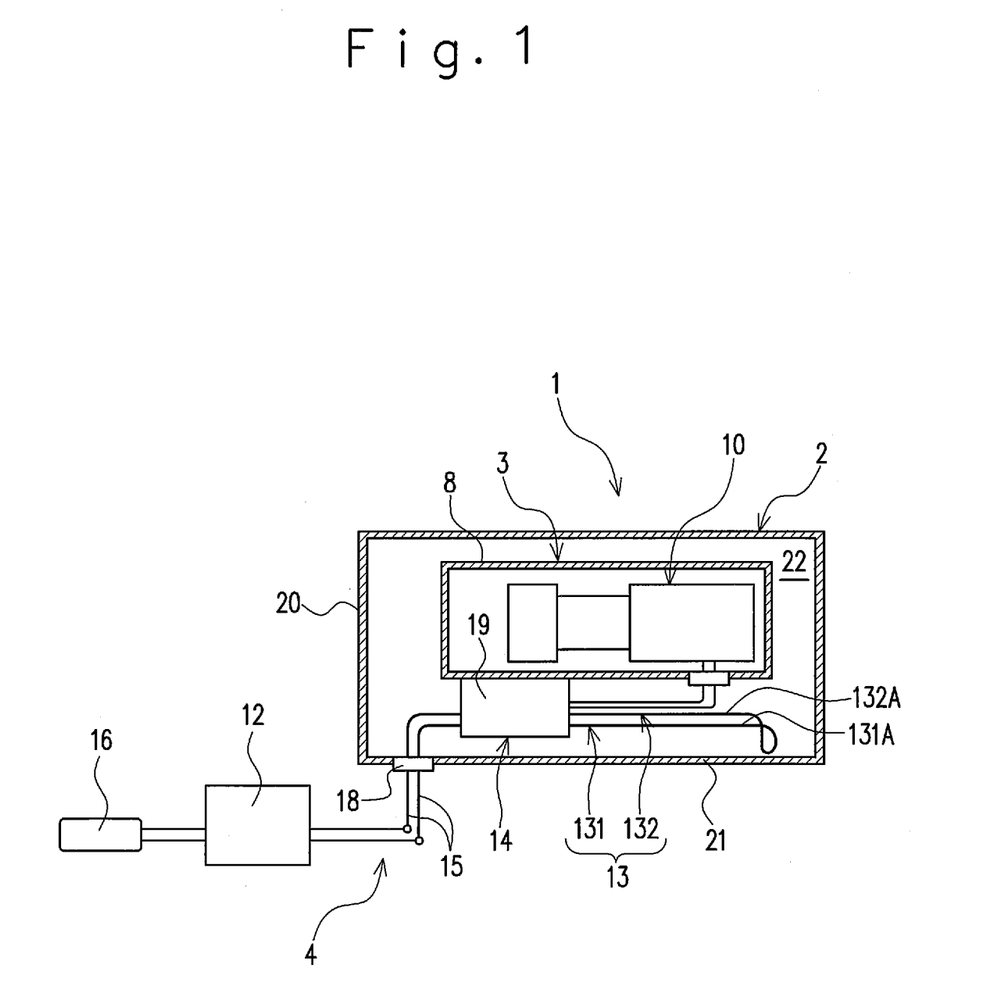
FIG. 1 is a schematic sectional side view of a vacuum processing apparatus showing a first embodiment of the present invention.

As shown in FIG. 1, a vacuum processing apparatus 1 in the first embodiment includes a closed container (referred to also as vacuum container) 2, a moving unit 3, and a non-contact power supply device 4. First, the schematic configuration of the vacuum processing apparatus 1 except the non-contact power supply device 4 will be described.

The closed container 2 is formed into a rectangular parallelepiped shape as a whole and is defined by an outer wall 20 between the inner and outer sides of the closed container 2. The inside of the closed container 2 is formed as a vacuum chamber 22. A pair of rails are installed parallel to each other on both sides of a bottom wall 21 of the closed container 2 (not shown). The moving unit 3 includes a movable body 8 in the form of a box that is guided to move along the pair of rails, a power supply transformer 14 configured to be movable with the movement of the movable body 8, and a drive unit (load) 10 that is constituted by a motor or the like and is arranged inside the movable body 8. The moving path of the movable body 8 is a path extending in a direction along the longitudinal direction of the closed container 2.

Next, the non-contact power supply device 4 having a characteristic configuration of the present invention will be described. The non-contact power supply device 4 includes a high frequency power supply 12, feed lines 13, the power supply transformer 14, and heat dissipaters 15. The high frequency power supply 12 is arranged outside the closed container 2 and is connected to a commercial power supply 16. Since the feed lines 13 are primary feed lines, the feed lines 13 are hereinafter referred to as primary feed lines 13. The primary feed lines 13 include two feed line parts of a first feed line part 131 and a second feed line part 132 as forward and return paths. The first feed line part 131 and the second feed line part 132 are made of electrically conductive materials (for example, aluminum) so as to have a circular cross section, though not shown in the figures.

The first feed line part 131 and the second feed line part 132 respectively have linear feed regions 131A and 132A. The middle portions in the longitudinal direction of the feed regions 131A and 132A are arranged inside the closed container 2. The positions of the feed regions 131A and 132A are maintained so that the feed regions 131A and 132A are spaced apart from the bottom wall 21 at a certain height. The feed regions 131A and 132A are arranged parallel to each other at an interval within a horizontal plane including the longitudinal direction of the closed container 2. The first feed line part 131 and the second feed line part 132 are arranged along the above-described pair of rails and between the pair of rails.

The portions on one end side (portions on one end side in the longitudinal direction) of the first feed line part 131 and the second feed line part 132 are integrated together by being bent continuously. The portions on the other end side of the first feed line part 131 and the second feed line part 132 are bent downward at a right angle and extend to be exposed outside the closed container 2 via a vacuum seal mechanism 18 mounted on the bottom wall 21. This allows the two portions on the other end side of the first feed line part 131 and the second feed line part 132 to serve as cylindrical (rod-shaped) heat dissipaters 15. The heat dissipaters 15 that are the portions on the other end side are electrically connected to the high frequency power supply 12.

Figure 2:
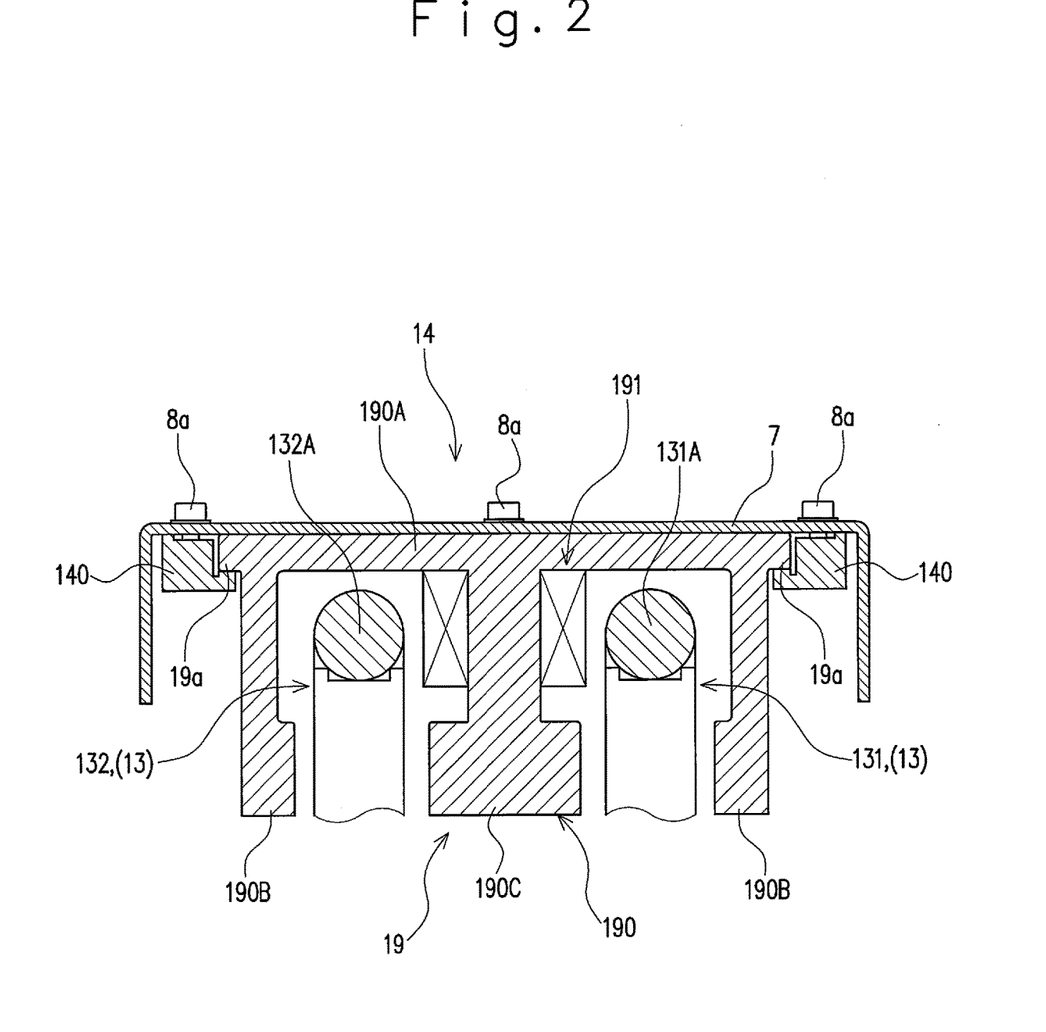
FIG. 2 is an enlarged sectional view of a power supply transformer thereof.

In this embodiment, a core 19 made of a magnetic material and a pickup coil constituted by a secondary winding 191 are arranged opposed to the primary feed lines 13, thereby forming the power supply transformer 14. Specifically, as shown in FIG. 2, the power supply transformer 14 includes the core 19 magnetically coupled to the primary feed lines 13 in a non-contact manner, the secondary winding 191 provided in the core 19, a base 7 attached onto the upper end surface of the power supply transformer 14, and a pair of locking members 140 for attaching the base 7 onto the upper end surface of the power supply transformer 14.

The core 19 is held in a floating like state above the bottom wall 21, and the electric power supplied to the first feed line part 131 and the second feed line part 132 is configured to be supplied toward the core 19 side in a non-contact manner. The core 19 includes a base part 190A, two leg parts 190B hanging from both sides of the base part 190A, and one leg part 190C hanging from the center of the base part 190A. The core 19 is formed to have an E-shaped cross section that is open downward. The secondary winding 191 is wound around the leg part 190C at the center. The feed region 131A and the feed region 132A of the primary feed lines 13 are respectively inserted into the upper sides of the two spaces between the one leg 190C at the center and the two leg parts 190B on both sides. In order to fix the secondary winding 191 to the leg part 190C, it is conceivable to fill the gaps between the base part 190A and the feed regions 131A and 132A with a resin material so as not to impede the movement of the core 19.

The pair of locking members 140 are locked in the vertical directions respectively by flanges 19a formed to project laterally at the upper end of the core 19. The locking members 140 each have the same length as the core 19 and are provided respectively at both ends of the upper end of the core 19. The center portion of the base 7 is placed on the upper end surface of the core 19, and the lateral portions of the base 7 on both sides are placed on the upper end surfaces of the locking members 140. The locking members 140 are brought into pressure contact with the flanges 19a of the core 19 by screwing mounting screws 8a from above the base 7 to the locking members 140 via the base 7, so that the base 7 is fixed to the upper end surface of the core 19.

In the vacuum processing apparatus 1 including the non-contact power supply device 4 configured as above, electric power is supplied from the secondary winding 191 to a drive unit 10 due to electromagnetic induction from the magnetic field generated by electric power (high-frequency current) supplied from the high frequency power supply 12 to the feed regions 131A and 132A of the primary feed lines 13 (the first feed line part 131 and the second feed line part 132). The feed regions 131A and 132A, the core 19, and the secondary winding 191 are arranged inside the closed container 2, thereby allowing the primary feed lines 13 to be directly opposed to the power supply transformer 14. Therefore, high coupling coefficient can be ensured. The drive unit 10 is driven by the supplied power, and the movable body 8 linearly moves back and forth along the moving path in the vacuum chamber 22 inside the closed container 2.

When electric power is supplied from the high frequency power supply 12 to the feed regions 131A and 132A of the primary feed lines 13, a loss occurs. This loss turns into heat to increase the temperature of the primary feed lines 13. In particular, in this embodiment, electric power is supplied from the high frequency power supply 12 to the feed regions 131A and 132A, and therefore the temperature of the primary feed lines 13 easily increases. Further, the feed regions 131A and 132A are arranged in the vacuum chamber 22 and are thus in an environment in which heat dissipation is particularly difficult.

Generally, heat-conduction, convection, and radiation are known as heat dissipation methods. However, in the case where the primary feed lines 13 that are heating elements are arranged in the closed container 2, which is a closed space, effects of heat-conduction and convection decrease, as compared with the case where the primary feed lines 13 are arranged in an open container, to increase the temperature of the primary feed lines 13 and the temperature inside the closed container 2. In the case where the pressure inside the closed container 2 is set to a pressure lower than the atmospheric pressure (for example, to a vacuum state), the effects of heat dissipation by heat-conduction and convection further decrease. In particular, at a degree of vacuum equal to or higher than the high vacuum state, heat-conduction and convection are ineffective, and therefore the heat dissipation performance considerably decreases. In other words, the primary feed lines 13 can possibly overheat in the non-contact power supply device 4 by the heat generated in the primary feed lines 13 as a loss.

However, in the non-contact power supply device 4 in this embodiment, the heat dissipaters 15 that are connected to the feed regions 131A and 132A so as to be capable of conducting heat and extend outside the closed container 2 are provided. The heat generated in the feed regions 131A and 132A is partially dissipated outside the closed container 2, and therefore the feed regions 131A and 132A (the primary feed lines 13) do not overheat.

Further, the primary feed lines 13 partially extend outside the closed container 2, and the extending portions are used as the heat dissipaters 15. Since the extending portions of the primary feed lines 13 serve also as the heat dissipaters 15, the number of parts used for heat dissipation inside the closed container 2 can be reduced.

Various modifications can be made without departing from the gist of the present invention. Further, the specific configuration of each part also is not limited to the above-described embodiment. Here, a second embodiment of the present invention will be described with reference to FIG. 3. In the second embodiment, the feed regions 131A and 132A of the first feed line part 131 and the second feed line part 132 are arranged inside the closed container 2, and portions on one end side and portions on the other end side of the first feed line part 131 and the second feed line part 132 extend from the bottom wall 21 to the outside of the closed container 2 via the vacuum seal mechanism 18.

Figure 3:
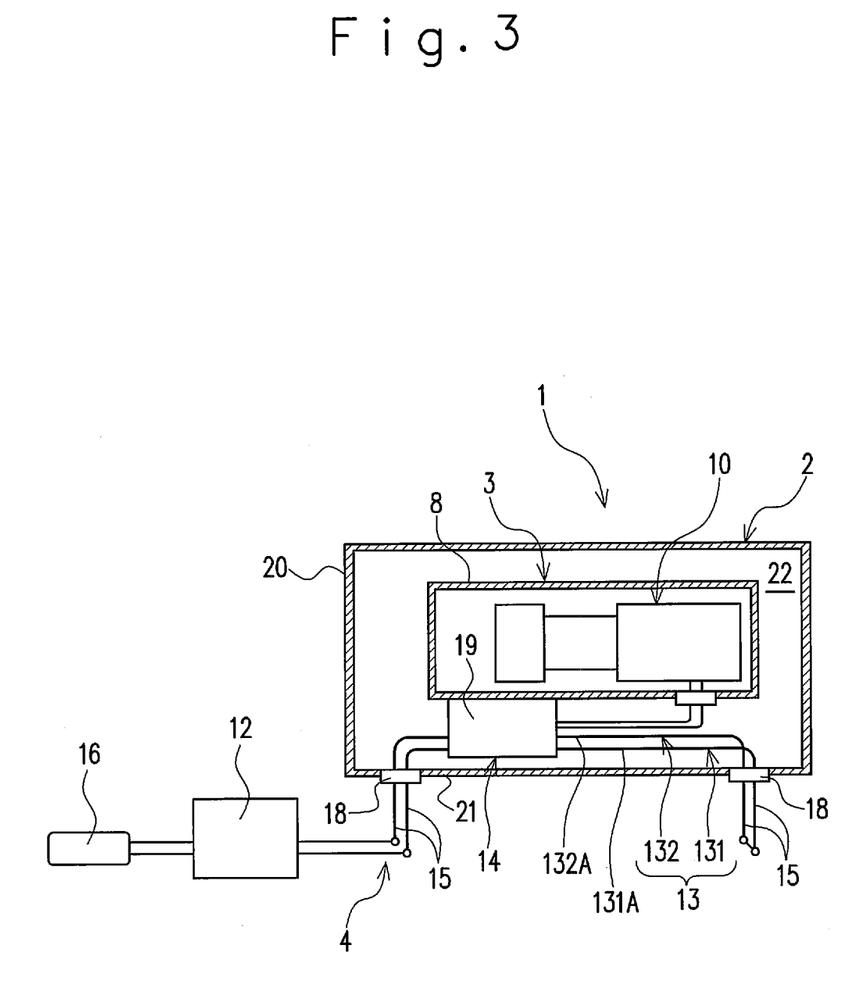
FIG. 3 is a schematic sectional side view of a vacuum processing apparatus showing a second embodiment of the present invention.

Then, the portions of the first feed line part 131 and the second feed line part 132 that extend outside the closed container 2 are configured to be used as the heat dissipaters 15. In the same manner as in the first embodiment, the high frequency power supply 12 is connected to the heat dissipaters 15 that are the portions on one end side of the first feed line part 131 and the second feed line part 132. Further, the heat dissipaters 15 that are the portions on the other end side of the first feed line part 131 and the second feed line part 132 are electrically connected to each other outside the closed container 2.

Other configurations are the same manner as in the first embodiment, and thus the description thereof is not repeated. According to the second embodiment, the portions on the other end side of the first feed line part 131 and the second feed line part 132 are connected to each other so as to be exposed outside the closed container 2, instead of being connected inside the closed container 2. Therefore, the number of the heat dissipaters 15 is increased, as compared with the first embodiment. Therefore, the heat dissipation performance is further improved. Further, since the portions on the other end side of the first feed line part 131 and the second feed line part 132 are not connected to each other inside the closed container 2, the heat dissipaters 15 can be easily extended. Other actions and effects are the same as in the first embodiment.

Figure 4:
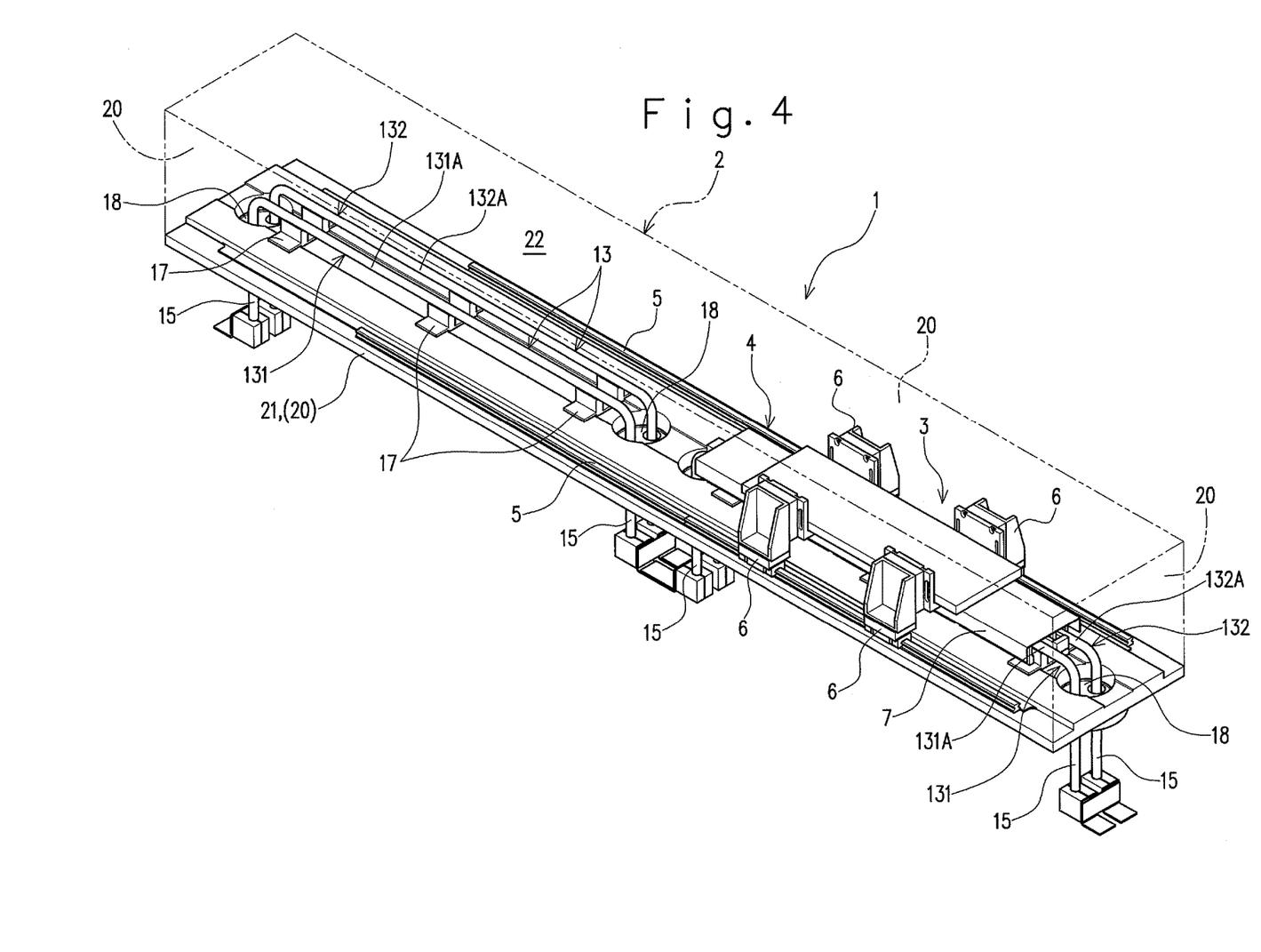
FIG. 4 is a perspective view of a vacuum processing apparatus showing a third embodiment of the present invention.
Figure 5:
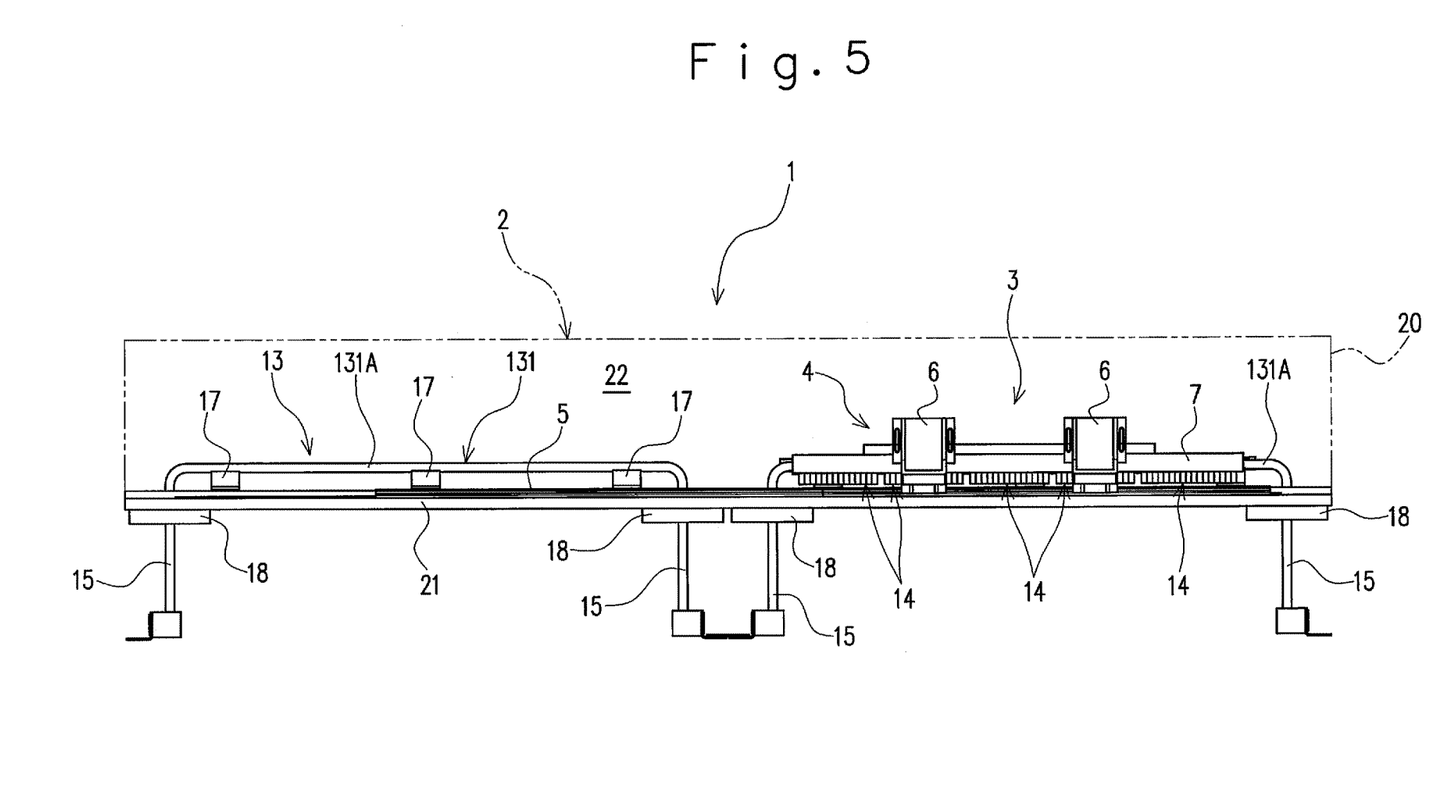
FIG. 5 is a side view of an overall configuration thereof.
Figure 6:
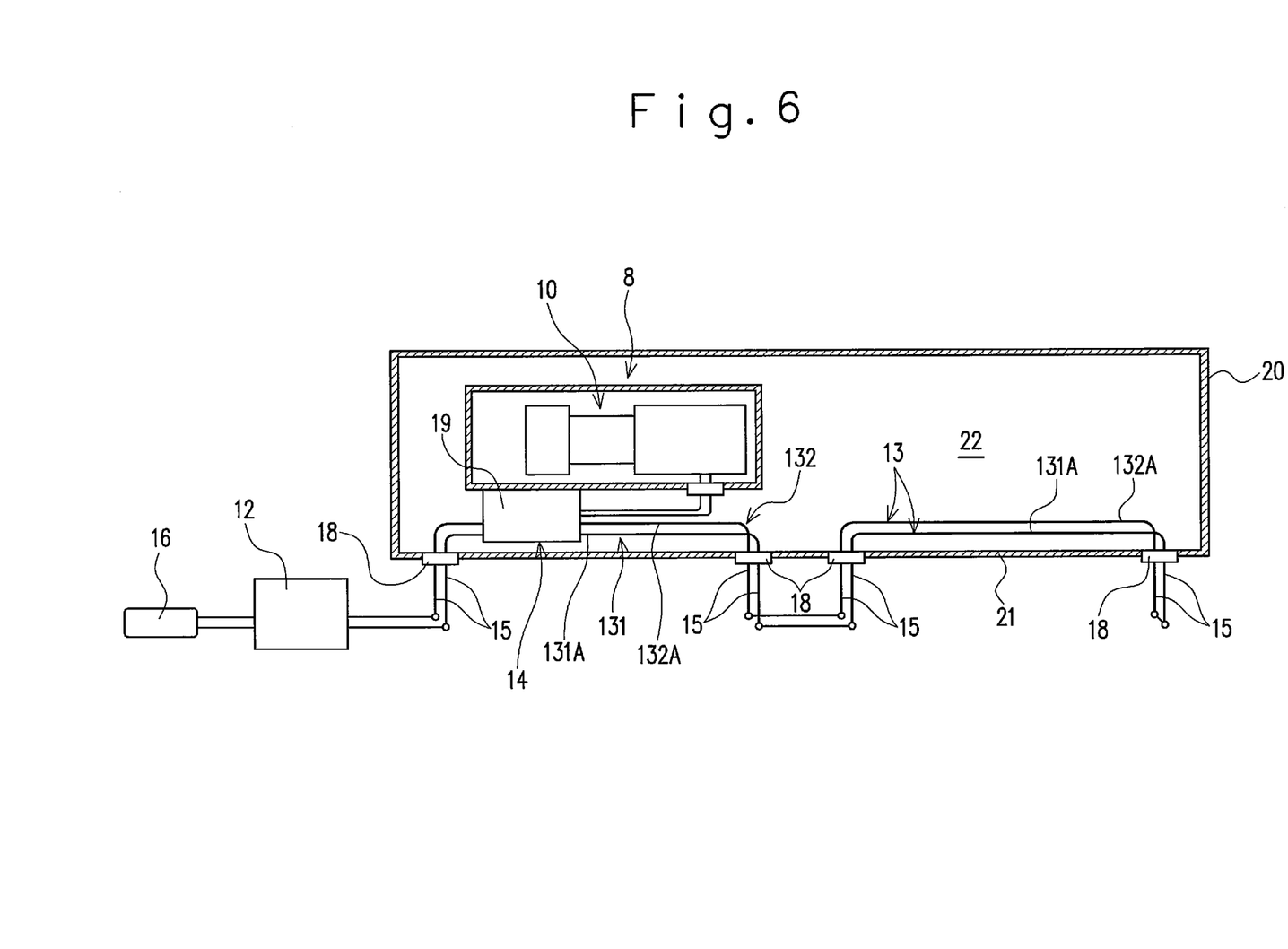
FIG. 6 is a schematic sectional view showing the overall configuration.

With reference to FIG. 4 to FIG. 6, a third embodiment of the present invention will be described. The vacuum processing apparatus 1 in the third embodiment includes the closed container 2, the moving unit 3, and the non-contact power supply device 4.

The closed container 2 is formed into a rectangular parallelepiped shape as a whole and is defined by an outer wall 20 between the inner and outer sides of the closed container 2. The inside of the closed container 2 is formed as a vacuum chamber 22. A pair of rails 5 extending along the longitudinal direction of the closed container 2 are installed parallel to each other on both sides of the bottom wall 21 of the closed container 2 (see FIG. 4). The moving unit 3 includes the base 7 attached to and supported by the pair of rails 5 via four support legs 6, the movable body 8 in the form of a box placed on and supported by the base 7, the power supply transformer 14 configured to be movable with the movement of the movable body 8, and the drive unit (load) 10 that is constituted by a motor or the like and is arranged inside the movable body 8. The moving path of the movable body 8 is formed by the pair of rails 5. That is, the moving path extends in a direction along the longitudinal direction of the closed container 2.

Next, the non-contact power supply device 4 having a characteristic configuration of the present invention will be described. The non-contact power supply device 4 includes the high frequency power supply 12, the feed lines 13, the power supply transformer 14, and the heat dissipaters 15. The high frequency power supply 12 is arranged outside the closed container 2 and is connected to the commercial power supply 16. The feed lines 13 are primary feed lines and includes two first feed line parts 131 and two second feed line parts 132 as four feed line parts for forward and return paths. The first feed line parts 131 and the second feed line parts 132 are respectively arranged parallel to each other between the pair of rails 5. The first feed line parts 131 and the second feed line parts 132 are each made of an electrically conductive material (for example, aluminum) so as to have a circular cross section.

The first feed line parts 131 and the second feed line parts 132 are respectively divided at the same position in the longitudinal direction into two, which are arranged at an interval in the longitudinal direction. The first feed line parts 131 on one end side in the longitudinal direction and on the other end side in the longitudinal direction and the second feed line parts 132 on one end side in the longitudinal direction and on the other end side in the longitudinal direction have the same configuration with only a difference in their arrangement. Therefore, the first feed line part 131 on one end side in the longitudinal direction and the second feed line part 132 on one end side in the longitudinal direction will be described below, and this description will be used also as description for the first feed line part 131 on the other end side in the longitudinal direction and the second feed line part 132 on the other end side in the longitudinal direction.

Hereinafter, the first feed line part 131 on one side in the longitudinal direction is referred to as "the first feed line part 131 on one side", the first feed line part 131 on the other side in the longitudinal direction is referred to as "the first feed line part 131 on the other side", the second feed line part 132 on one side in the longitudinal direction is referred to as "the second feed line part 132 on one side", and the second feed line part 132 on the other side in the longitudinal direction is referred to as "the second feed line part 132 on the other side".

The first feed line part 131 on one side and the second feed line part 132 on one side respectively include the linear feed regions 131A and 132A. The middle portions in the longitudinal direction of the feed regions 131A and 132A are arranged inside the closed container 2. The feed regions 131A and 132A are held via a support base 17 so that the positions of the feed regions 131A and 132A are spaced apart from the bottom wall 21 at a certain height (see FIG. 4). The feed regions 131A and 132A are arranged along the above-described pair of rails 5 and between the pair of rails 5.

The portions on one end side of the first feed line part 131 and the second feed line part 132 (portions on one end side in the longitudinal direction) are bent downward at a right angle and extend to be exposed outside the closed container 2 via the vacuum seal mechanism 18 mounted on the bottom wall 21. This allows the two portions on one end side of the first feed line part 131 and the second feed line part 132 to serve as the rod-shaped heat dissipaters 15. The heat dissipaters 15 that are the portions on one end side are electrically connected to the high frequency power supply 12. The portions on the other end side of the first feed line part 131 and the second feed line part 132 are bent downward at a right angle and extend to be exposed outside the closed container 2 via the vacuum seal mechanism 18 mounted on the bottom wall 21. This allows the two portions on the other end side of the first feed line part 131 and the second feed line part 132 to serve as the rod-shaped heat dissipaters 15.

In this embodiment, the heat dissipaters 15 are specified as regions exposed outside the closed container 2, but can be specified as portions other than the feed regions 131A and 132A in the first feed line part 131 and the second feed line part 132.

Relative to the first feed line part 131 on one side, the first feed line part 131 on the other side having the same configuration as in the first feed line part 131 on one side is provided at an interval in the longitudinal direction. Relative to the second feed line part 132 on one side, the second feed line part 132 on the other side having the same configuration as in the second feed line part 132 on one side is provided at an interval in the longitudinal direction.

The first feed line parts 131 have the same configuration, and the second feed line parts 132 have the same configuration. The two portions on one end side and the two portions on the other end side of the first feed line part 131 on the other end side and the second feed line part 132 on the other end side extend to be exposed outside the closed container 2 via the vacuum seal mechanism 18 mounted on the bottom wall 21. This allows the two portions on one side and the two portions on the other side of the first feed line part 131 on the other end side and the second feed line part 132 on the other end side to serve as the rod-shaped heat dissipaters 15. That is, eight heat dissipaters 15 are provided in the third embodiment. The heat dissipaters 15 are integrally formed by bending the first feed line parts 131 or the second feed line parts 132, and therefore the feed regions 131A and 132A are connected to the heat dissipaters 15 so as to be capable of transferring heat. Further, the feed regions 131A and 132A are electrically connected to the heat dissipaters 15. In this case, the heat dissipaters 15 function also as the feed lines 13.

The portion on the other end side of the first feed line part 131 on one side and the portion on one end side of the first feed line part 131 on the other side, that is, the heat dissipaters 15 of the two first feed line parts 131 are electrically connected to each other. The portion on the other end side of the second feed line part 132 on one side and the portion on one end side of the second feed line part 132 on the other side, that is, the heat dissipaters 15 of the two second feed line parts 132 are electrically connected to each other. Further, the portion on the other end side of the first feed line part 131 on the other side and the portion on the other end side of the second feed line part 132 on the other side, that is, the heat dissipaters 15 are electrically connected to each other.

The configuration of the power supply transformer 14 is the same as in the first embodiment, and thus the description thereof is not repeated. However, in this embodiment, a plurality of power supply transformers 14 are provided adjacent to each other in the longitudinal direction, as shown in FIG. 5.

In the vacuum processing apparatus 1 including the non-contact power supply devices 4 configured as above, electric power is supplied from the secondary winding 191 to the drive unit 10 due to electromagnetic induction from the magnetic field generated by electric power (high-frequency current) supplied from the high frequency power supply 12 to the feed regions 131A and 132A of the feed lines 13 (the first feed line parts 131 and the second feed line parts 132). The feed regions 131A and 132A and the power supply transformers 14 are arranged inside the closed container 2, and the feed regions 131A and 132A are directly opposed to the power supply transformers 14, so that the coupling coefficient can be ensured. The drive unit 10 is driven by the supplied power, and the movable body 8 linearly moves back and forth along the moving path together with the support legs 6 in the vacuum chamber 22 inside the closed container 2, while the support legs 6 are guided by the pair of rails 5.

When electric power is supplied from the high frequency power supply 12 to the feed regions 131A and 132A of the feed lines 13, a loss occurs. This loss turns into heat to increase the temperature of the feed lines 13. In particular, in this embodiment, electric power is supplied from the high frequency power supply 12 to the feed regions 131A and 132A, and therefore the temperature of the feed lines 13 easily increases. Further, the feed regions 131A and 132A are arranged in the vacuum chamber 22, and thus are in an environment in which heat dissipation is particularly difficult.

However, in the non-contact power supply device 4 in this embodiment, the four heat dissipaters 15 including two portions on one end side that are connected to the feed regions 131A and 132A so as to be capable of conducting heat and two portions on the other end side that extend outside the closed container 2 are provided. The heat generated in the feed regions 131A and 132A is partially dissipated outside the closed container 2, and therefore the feed regions 131A and 132A do not overheat.

Other actions and effects are the same as in the second embodiment. Moreover, according to the third embodiment, the vacuum processing apparatus 1 (the vacuum chamber 22) having a desired length in the longitudinal direction can be easily obtained by adding (extending) the first feed line part 131 and the second feed line part 132 having the same configuration as the first feed line parts 131 and the second feed line parts 132 described above further in the longitudinal direction, and connecting the heat dissipaters 15 thereof to each other.

Conversely, it is also possible to further divide the first feed line parts 131 and the second feed line parts 132 to be shorter. This increases the number of heat dissipaters 15 that can be arranged in one closed container 2, and thus the heat dissipation performance can be improved to such an extent.

Figure 7:
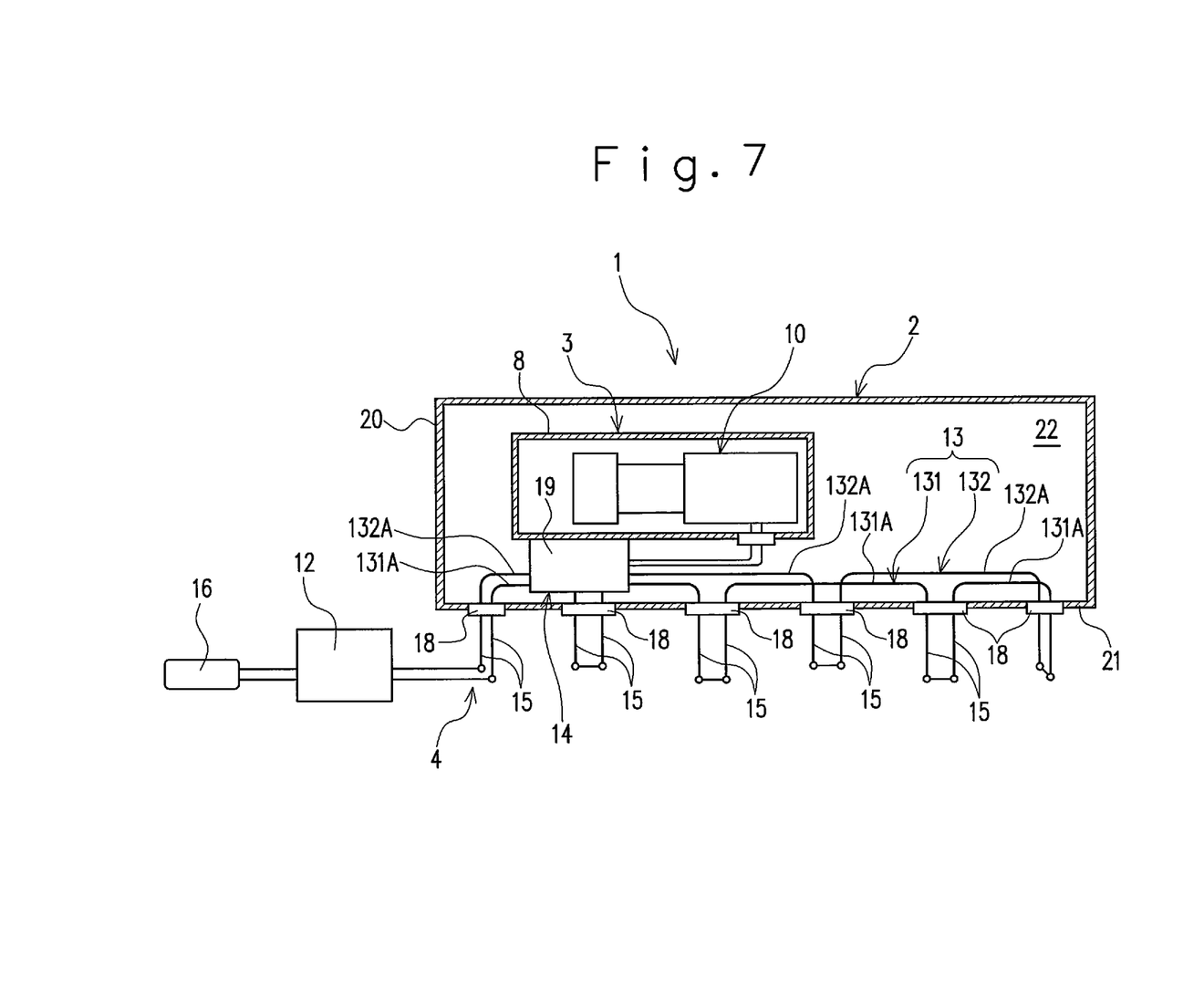
FIG. 7 is a schematic sectional side view of a vacuum processing apparatus showing a fourth embodiment of the present invention.

A fourth embodiment of the present invention will be described with reference to FIG. 7. In the fourth embodiment, the first feed line part 131 and the second feed line part 132 are each divided into three in the longitudinal direction and are arranged at intervals in the longitudinal direction. The first feed line part 131 and the second feed line part 132 are each divided into three in the longitudinal direction, thereby providing three feed regions 131A and 132A respectively in the first feed line part 131 and the second feed line part 132.

The divided positions of the first feed line part 131 and the divided positions of the second feed line part 132 are displaced from each other in the longitudinal direction. The portions on both sides in the longitudinal direction of the first feed line part 131 and the second feed line part 132 extend from the bottom wall 21 via the vacuum seal mechanism 18 to be exposed outside the closed container 2 respectively at the divided positions of the first feed line part 131 and the divided positions of the second feed line part 132, so as to serve as the heat dissipaters 15.

The heat dissipaters 15 in the middle portions in the longitudinal direction of the first feed line part 131 are electrically connected to each other. The heat dissipaters 15 in the middle portions in the longitudinal direction of the second feed line part 132 are electrically connected to each other. Further, the two heat dissipaters 15 at the ends on one side in the longitudinal direction are connected to the high frequency power supply 12 outside the closed container 2. The two heat dissipaters 15 at the ends on the other side in the longitudinal direction are connected to each other.

The amount of the above-described displacement in the longitudinal direction between the divided positions of the first feed line part 131 and the divided positions of the second feed line part 132 is set so that only one of the intervals in the longitudinal direction of the divided positions of the first feed line part 131 and the divided positions of the second feed line part 132 is present at the position where the power supply transformer 14 (specifically, the core 19) is present, regardless of the position of the power supply transformer 14. Other configurations are the same as in the third embodiment. Therefore, components having the same functions are denoted by the same reference numerals and the description thereof is not repeated.

According to the above-described configuration, the divided positions of the feed line parts (that is, portions where the feed regions are not present) at the position where the power supply transformer 14 is present can be halved as compared with the third embodiment. Therefore, even if the first feed line part 131 divided and thus having joint portions is combined with the second feed line part 132 divided and thus having joint portions, a decrease in output at the joint portions can be reduced to half.

Figure 8:
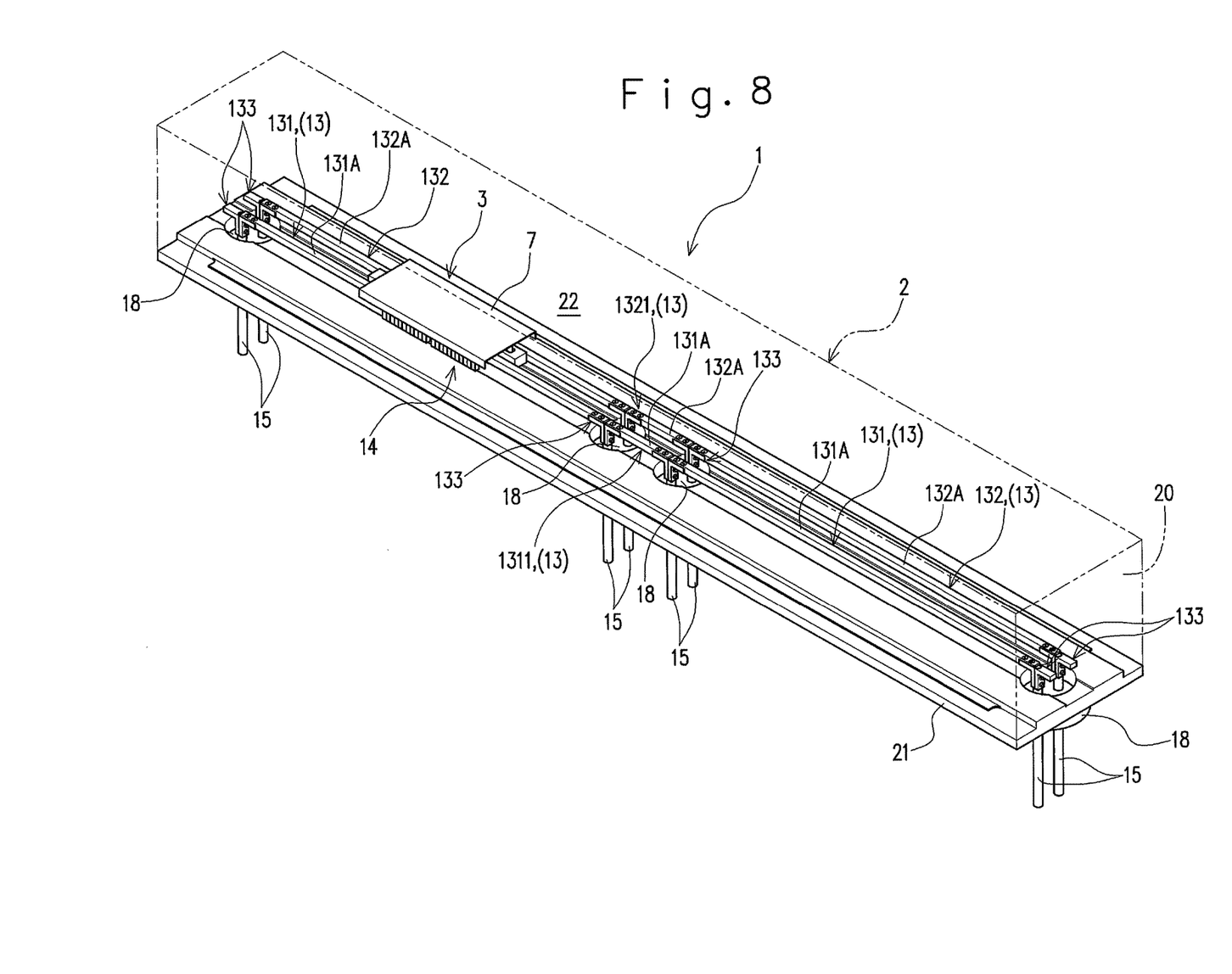
FIG. 8 is a schematic sectional side view of a vacuum processing apparatus showing a fifth embodiment of the present invention.
Figure 9:
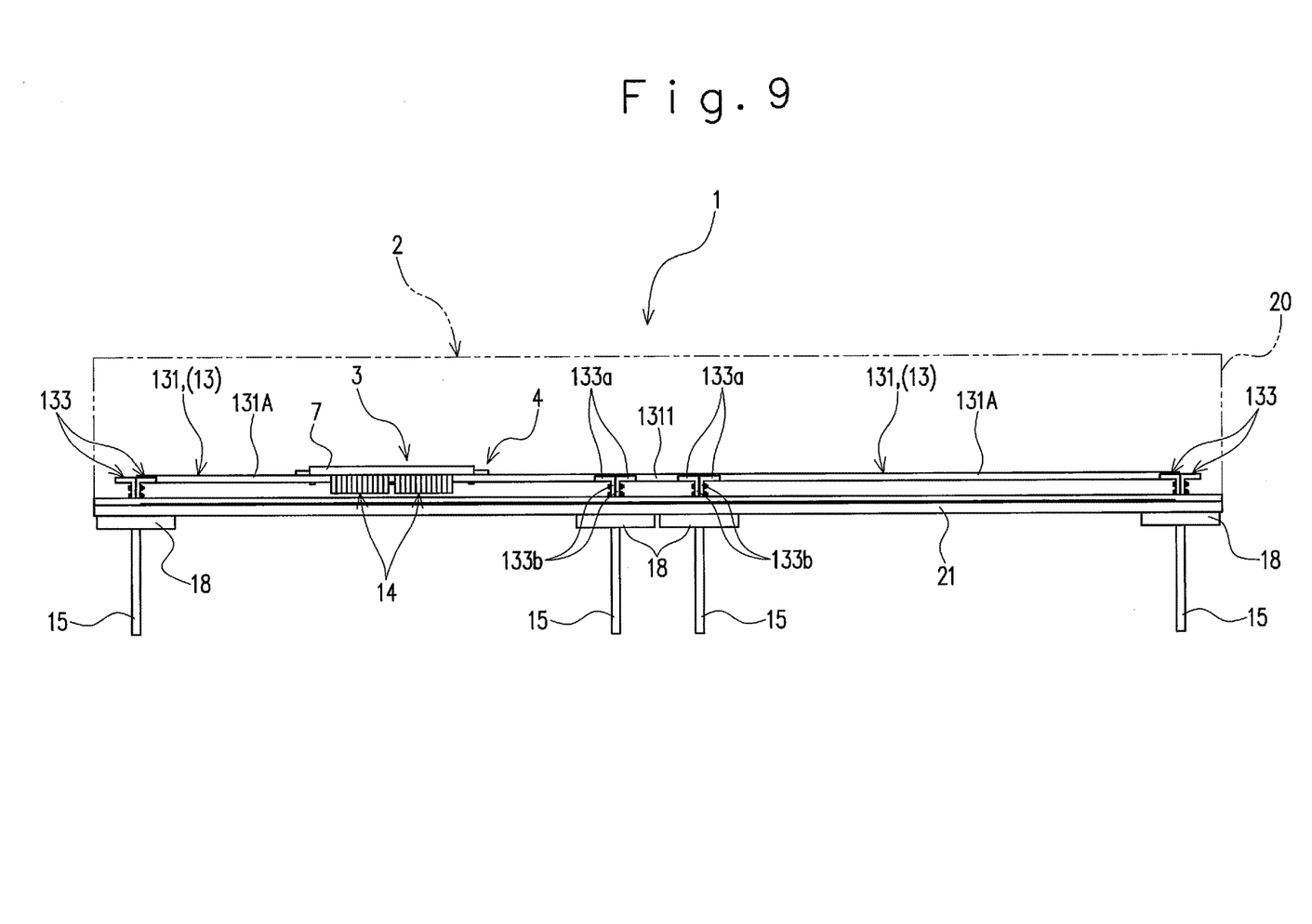
FIG. 9 is a side view showing an overall configuration thereof.

A fifth embodiment will be described with reference to FIG. 8 and FIG. 9. In the non-contact power supply device 4 in the fifth embodiment, the first feed line part 131 is divided in the longitudinal direction into two, which are arranged at an interval in the longitudinal direction. The first feed line part 131 on one side and the first feed line part 131 on the other side are electrically connected to each other by a first feed line part (feed line for joint) 1311 at the center. The dimension in the longitudinal direction of the first feed line part 1311 at the center is set to be shorter than the dimension in the longitudinal direction of the first feed line parts 131 on both sides. The entirety in the longitudinal direction of the first feed line part 1311 at the center serves as a feed region.

The second feed line part 132 is divided in the longitudinal direction into two, which are arranged at an interval in the longitudinal direction. The second feed line part 132 on one side and the second feed line part 132 on the other side are electrically connected to each other by a second feed line part (feed line for joint) 1321 at the center. The dimension in the longitudinal direction of the second feed line part 1321 at the center is set to be shorter than the dimension in the longitudinal direction of the second feed line parts 132 on both sides.

The first feed line parts 131 and 1311 that are adjacent to each other in the longitudinal direction are connected via a connecting member 133 made of an electrically conductive material. The second feed line parts 132 and 1321 that are adjacent to each other in the longitudinal direction are connected via the connecting member 133 made of an electrically conductive material. As shown in FIG. 9, the connecting member 133 is in the form of an L-shaped angle and includes a mounting piece 133a in the form of a flat plate and a hanging part 133b hanging from an end in the longitudinal direction of the mounting piece 133a.

In a portion in which the first feed line parts 131 and 1311 are connected together, hanging parts 133b of a pair of connecting members 133 are arranged to be opposed to each other in the longitudinal direction. In a portion in which the second feed line parts 132 and 1321 are connected together, hanging parts 133b of a pair of connecting members 133 are arranged so as to be opposed to each other in the longitudinal direction. Then, ends in the longitudinal direction of the first feed line parts 131 and the second feed line parts 132 are placed on the mounting pieces 133a of the connecting members 133 and are screwed thereon.

The upper end of a round bar (which may be a square bar) serving as a heat dissipater 15 made of an electrically conductive material is sandwiched between the pair of hanging parts 133b of the pair of connecting members 133. Thus, the heat dissipater 15 is connected to the primary feed lines 13 so as to be capable of conducting heat.

In other words, the upper end side of the heat dissipater 15 is connected to the first feed line parts 131 and 1311, and the other end side of the heat dissipater 15 extends downward perpendicularly to the first feed line parts 131 and 1311 to be exposed outside the container, passing through the bottom wall 21 of the closed container 2. Further, the upper end side of the heat dissipater 15 is connected to the second feed line parts 132 and 1321, and the other end side of the heat dissipater 15 extends downward perpendicularly to the second feed line parts 132 and 1321 to be exposed outside the container, passing through the bottom wall 21 of the closed container 2.

Pairs of connecting members 133 are also connected to both ends of the first feed line parts 131 and the second feed line parts 132 on both sides in the longitudinal direction. The heat dissipaters 15 are electrically connected to the connecting members 133 so as to be capable of conducting heat. Vacuum seal mechanisms 18 configured to close the gaps with the heat dissipaters 15 are provided in through holes of the bottom wall 21 through which the heat dissipaters 15 connected to both ends of the first feed line parts 131 and the second feed line parts 132 pass.

A pair of heat dissipaters 15 at the ends on one side in the longitudinal direction are connected to the high frequency power supply 12, and are electrically connected to the first feed line parts 131 or the second feed line parts 132 so as to be capable of conducting heat. A pair of heat dissipaters 15 arranged at the ends on the other side in the longitudinal direction are electrically connected to each other, and are electrically connected to the first feed line parts 131 or the second feed line parts 132 so as to be capable of conducting heat. This configuration allows the heat generated in the first feed line parts 131 and the second feed line parts 132 to be dissipated by the heat dissipaters 15 outside the closed container 2.

In the fifth embodiment, the first feed line part 131 and the second feed line part 132 are each divided into two, which are connected by the first feed line parts (feed lines for joint) 1311 and 1321 at the center. Therefore, as compared with the case of forming one feed line with the same length in the longitudinal direction, the heat generated in the first feed line parts 131 and 1311 and the second feed line parts 132 and 1321 can be reduced.

Further, the heat dissipaters 15 are hung from the first feed line part 1311 and the second feed line part 1321, and are configured to have a T-shape in side view when combined with the first feed line part 131 and the second feed line part 132. This configuration allows the first feed line part 1311 and the second feed line part 1321 to ensure electric path portions. Feed regions are formed over the entirety in the longitudinal direction without providing intervals at divided positions between the feed line parts. Accordingly, a decrease in output of the power supply transformer 14 is suppressed, even if the feed line parts are divided.

Further, a high-frequency current flows through the first feed line part 1311 and the second feed line part 1321, but the heat dissipaters 15 are simply hung therefrom. Therefore, the high-frequency current does not flow through the heat dissipaters 15. Therefore, there is no increase in temperature of the heat dissipaters 15 due to energization. This configuration facilitates dissipation of heat generated in the first feed line parts 131 and 1311 and the second feed line parts 132 and 1321 by the heat dissipaters 15, and therefore the heat dissipation efficiency is improved.

In the fifth embodiment, the case where the first feed line part 1311 and the second feed line part 1321 are arranged one by one for the feed regions 131A and 132A is described as an example. However, it is also possible to divide the feed regions 131A and 132A at a plurality of points, and to connect them by first feed line parts 1311 and second feed line parts 1321 that are feed lines for joint. In this case, a position in which the first feed line part 1311 and the second feed line part 1321 are arranged is set to be present for each position where the power supply transformer 14 is present, regardless of the moved position of the power supply transformer 14. As a result, eddy currents generated due to the power supply transformer 14 being present at a position opposed to the heat dissipaters 15 are averaged, so that a reduction in conversion efficiency into power by the power supply transformer 14 and variation in output of the power supply transformer 14 are suppressed, thereby allowing stable output to be obtained.

Summary of the aforementioned explanation is described. The non-contact power supply device 4 according to the above-described embodiments that is used in the vacuum processing apparatus 1 including the closed container 2 and the moving unit 3 configured to be movable inside the closed container 2 and that is capable of supplying electric power to the moving unit 3 from outside the closed container 2 includes: a feed unit and the heat dissipaters 15, wherein the feed unit includes the feed lines 13 (131 and 132) and the power supply transformer 14, the feed lines 13 (131 and 132) have the feed regions 131A and 132A arranged along the moving direction of the moving unit 3 inside the closed container 2, the power supply transformer 14 is arranged inside the closed container 2 so as to be opposed to the feed regions 131A and 132A in a non-contact manner and is provided to move together with the moving unit 3, and the heat dissipaters 15 include portions on one end side connected to the feed regions 131A and 132A so as to be capable of conducting heat thereto and portions on the other end side extending outside the closed container 2.

In the non-contact power supply device 4 according to the above-described embodiments, electric power to move the moving unit 3 is supplied from the feed regions 131A and 132A of the feed lines 13 (131 and 132), for example, to a motor or the like mounted on the moving unit 3 via the power supply transformer 14. The electric power applied to the feed regions 131A and 132A of the feed lines 13 (131 and 132) partially turns into heat as a loss. Meanwhile, the portions on one end side of the heat dissipaters 15 are connected to the feed regions 131A and 132A so as to be capable of conducting heat thereto, and the portions on the other end side thereof extend outside the closed container 2. Therefore, the heat generated in the feed lines 13 (131 and 132) as a loss is dissipated, even if the feed lines 13 (131 and 132) are arranged inside the closed container 2 so that the feed regions 131A and 132A are opposed to the power supply transformer 14 in a non-contact manner.

In the non-contact power supply device 4 according to the above-described embodiments, a configuration in which the portions on one end side of the heat dissipaters 15 are electrically connected to the feed regions 131A and 132A, and electric power is supplied from the portions on the other end side of the heat dissipaters 15 to the feed regions 131A and 132A can be employed.

When the electric power to be supplied to the feed regions 131A and 132A is obtained outside the closed container 2 through the portions on the other end side of the heat dissipaters 15, as in the above-described configuration, the feed lines 13 (131 and 132) can serve also as the heat dissipaters 15.

In the non-contact power supply device 4 according to the above-described embodiments, a configuration in which a plurality of connecting parts (1311 and 1321) configured to connect the portions on one end side of the heat dissipaters 15 to the feed regions 131A and 132A of the feed lines 13 (131 and 132) are provided, and the plurality of connecting parts (1311 and 1321) are arranged along the longitudinal direction of the feed regions 131A and 132A, so that an equal number of connecting parts (1311 and 1321) are present at a position where the power supply transformer 14 is present, regardless of the position of the power supply transformer 14, can be employed.

According to the above-described configuration, even if the plurality of connecting parts (1311 and 1321) are arranged in the portions on one end side of the heat dissipaters 15 and the feed regions 131A and 132A of the feed lines 13 (131 and 132), an equal number of connecting parts (1311 and 1321) are present for each position where the power supply transformer 14 is present, regardless of the moved position of the power supply transformer 14. Therefore, eddy currents generated due to the power supply transformer 14 being present at a position opposed to the heat dissipaters 15 are averaged, so that variation in output of the power supply transformer 14 is suppressed.

In the non-contact power supply device 4 according to the above-described embodiments, a configuration in which the closed container 2 is capable of maintaining its internal pressure lower than the atmospheric pressure can be employed.

According to the above-described configuration, heat dissipation is made difficult in the feed regions 131A and 132A inside the closed container 2 than in the case of the atmospheric pressure, particularly, by maintaining the internal pressure of the closed container 2 lower than the atmospheric pressure. Even in such a case, the heat generated in the feed regions 131A and 132A is partially dissipated from the portions on the other end side of the heat dissipaters 15 outside the closed container 2.

The vacuum processing apparatus 1 according to the above-described embodiments includes the closed container 2, the moving unit 3 provided inside the closed container 2 so as to be movable inside the closed container 2, and the non-contact power supply device 4.

As described above, in the vacuum processing apparatus 1 according to the above-described embodiments, the electric power applied to the feed regions 131A and 132A of the feed lines 13 (131 and 132) partially turns into heat as a loss. The portions on one end side of the heat dissipaters 15 are connected to the feed regions 131A and 132A so as to be capable of conducting heat thereto, and the portions on the other end side thereof extend outside the closed container 2. Therefore, even if the feed regions 131A and 132A are arranged inside the closed container 2 so as to be opposed to the power supply transformer 14 in a non-contact manner, the heat generated in the feed lines 13 (131 and 132) as a loss is dissipated.

In the above-described embodiments, it is matter of course that a cable coated with an insulating layer may be used for the primary feed lines. Further, aluminum is mentioned in the above-described embodiments as an example of the primary feed lines, but the primary feed lines may be of copper materials, or other conductor materials.

In the case of using a cable for the primary feed lines, the primary feed lines are coated with an insulating layer. For the above-described reasons, the heat generated in the primary feed lines 13 as a loss may possibly cause the primary feed lines 13 to overheat in the non-contact power supply device 4. Such overheating causes burnout of the insulating layer of the primary feed lines 13, or causes a gas to be generated from the insulating layer or the feed lines as conductors, in addition to the burnout. The gas reduces the degree of vacuum inside the closed container 2.

However, in the present invention, the heat dissipaters 15 that are connected to the feed regions so as to be capable of conducting heat thereto and extend outside the closed container 2 are provided, and the heat generated in the feed regions is partially dissipated from the heat dissipaters 15 outside the closed container 2. Therefore, the heat does not cause the feed regions 131A and 132A (the primary feed lines 13) to overheat. As a result, in the present invention, the insulating layer of the primary feed lines 13 is not burned out, and the gas is not generated from the insulating layer and the feed lines due to the heat. Accordingly, the degree of vacuum inside the closed container 2 is not reduced.

In the above-described embodiments, the heat dissipaters are configured to extend from the bottom wall of the closed container to the outside. However, the heat dissipaters can extend from an outer wall (including the top wall) of the closed container, which is not necessarily the bottom wall. Likewise, the feed lines also are not necessarily configured to be introduced or extend from the bottom wall of the closed container, and can be introduced or extend from an outer wall of the closed container, which is not necessarily the bottom wall. Likewise, the power supply transformer also is not limited to the configuration of being arranged on the bottom wall side of the closed container, and can be configured to move along an outer wall of the closed container, which is not necessarily the bottom wall.

Further, in the above-described embodiments, the case of use in the vacuum processing apparatus in which the pressure inside the closed container is maintained lower than the atmospheric pressure is described as an example. However, the present invention can be applied in a processing apparatus in which the feed regions are arranged inside the closed container, and the pressure inside the closed container is maintained at atmospheric pressure.

The non-contact power supply device and the processing apparatus according to the present embodiments are as described above, but the present invention is not limited to the above-described embodiments, and the design can be appropriately modified within the scope intended by the present invention. The operational advantage of the present invention is also not limited to the foregoing embodiments.

The embodiments disclosed herein should be construed in all respects as illustrative but not limiting. The scope of the present invention is not indicated by the foregoing description but by the scope of the claims. Further, the scope of the present invention is intended to include all the modifications equivalent in the sense and the scope to the scope of the claims.

What is claimed is:

1. A non-contact power supply device that is used in a processing apparatus including a closed container and a moving unit provided inside the closed container so as to be movable inside the closed container, and that is capable of supplying electric power to the moving unit from outside the closed container, the non-contact power supply device comprising:
   a feed unit; and
   a heat dissipator, wherein
   the feed unit comprises a feed line and a power supply transformer,
   the feed line comprises a feed region arranged inside the closed container along the moving direction of the moving unit,
   the power supply transformer is arranged inside the closed container so as to be opposed to the feed region in a non-contact manner and is provided to move together with the moving unit, and
   the heat dissipator comprises a portion on one end side connected to the feed region so as to be capable of conducting heat thereto and a portion on the other end side extending outside the closed container.

2. The non-contact power supply device according to claim 1, wherein
   the portion on one end side of the heat dissipator is electrically connected to the feed region, and electric power is supplied from the portion on the other end side of the heat dissipator to the feed region.

3. The non-contact power supply device according to claim 1, further comprising:
   a plurality of connecting parts configured to connect the portion on one end side of the heat dissipator to the feed region of the feed line, wherein
   the plurality of connecting parts are arranged along the longitudinal direction of the feed region, so that an equal number of connecting parts are present at a position where the power supply transformer is present, regardless of the position of the power supply transformer.

4. The non-contact power supply device according to claim 1, wherein
   the closed container is capable of maintaining its internal pressure lower than the atmospheric pressure.

5. A processing apparatus comprising:
   a closed container;
   a moving unit provided inside the closed container so as to be movable inside the closed container; and
   a non-contact power supply that is capable of supplying electric power to the moving unit from outside the closed container, the non-contact power supply device comprising:
   a feed unit; and
   a heat dissipator, wherein
   the feed unit comprises a feed line and a power supply transformer,
   the feed line comprises a feed region arranged inside the closed container along the moving direction of the moving unit,
   the power supply transformer is arranged inside the closed container so as to be opposed to the feed region in a non-contact manner and is provided to move together with the moving unit, and
   the heat dissipator comprises a portion on one end side connected to the feed region so as to be capable of conducting heat thereto and a portion on the other end side extending outside the closed container.

6. The processing apparatus according to claim 5, further comprising a drive unit.

7. The processing apparatus according to claim 6, wherein the drive unit comprises an electric motor arranged inside the movable body.

* * * * *